(12) United States Patent
Lee (10) Patent No.: US 7,821,197 B2
(45) Date of Patent: Oct. 26, 2010

(54) ORGANIC LIGHT EMITTING DISPLAY AND FABRICATING METHOD OF THE SAME

(75) Inventor: Jong Woo Lee, Yongin-si (KR)

(73) Assignee: Samsung Mobile Display Co., Ltd. (KR)

( * ) Notice: Subject to any disclaimer, the term of this patent is extended or adjusted under 35 U.S.C. 154(b) by 966 days.

(21) Appl. No.: 11/541,048

(22) Filed: Sep. 29, 2006

(65) Prior Publication Data

US 2007/0177069 A1     Aug. 2, 2007

(30) Foreign Application Priority Data

Jan. 27, 2006    (KR) .................... 10-2006-0008769

(51) Int. Cl.
*H05B 33/00*   (2006.01)

(52) U.S. Cl. ...................... 313/504; 313/512

(58) Field of Classification Search .......... 313/498–512
See application file for complete search history.

(56) References Cited

U.S. PATENT DOCUMENTS

| | | | |
|---|---|---|---|
| 3,966,449 A | 6/1976 | Foster | |
| 4,004,936 A | 1/1977 | Powell | |
| 4,105,292 A | 8/1978 | Conder et al. | |
| 4,238,704 A | 12/1980 | Bonk et al. | |
| 4,702,566 A | 10/1987 | Tukude | |
| 4,826,297 A | 5/1989 | Kubo et al. | |
| 4,984,059 A | 1/1991 | Kubota et al. | |
| 5,808,719 A * | 9/1998 | Fujiwara et al. | ............. 349/157 |
| 5,811,927 A | 9/1998 | Anderson et al. | |
| 5,965,907 A | 10/1999 | Huang et al. | |
| 6,005,653 A | 12/1999 | Matsuzawa | |
| 6,087,717 A | 7/2000 | Ano et al. | |
| 6,195,142 B1 | 2/2001 | Gyotoku et al. | |
| 6,210,815 B1 | 4/2001 | Ooishi | |
| 6,211,938 B1 | 4/2001 | Mori | |
| 6,288,487 B1 | 9/2001 | Arai | |

(Continued)

FOREIGN PATENT DOCUMENTS

CN         1290121 A      4/2001

(Continued)

OTHER PUBLICATIONS

Japan Office Action dated Jul. 28, 2009 of the Japanese Patent Application No. 2006-153567.

(Continued)

*Primary Examiner*—Nimeshkumar D Patel
*Assistant Examiner*—Anne M Hines
(74) *Attorney, Agent, or Firm*—Knobbe Martens Olson & Bear LLP (57) ABSTRACT

Disclosed are an organic light emitting display device and a method of making the same. A first mother substrate includes a first display array and a second display array. A second mother substrate is attached to the first mother substrate in order to seal the arrays. A frit is formed at non-pixel regions of the first mother substrate and the second mother substrate. The frit interconnects the first and second mother substrates to each other. A reinforcing member is formed along the frit. A metal pattern is formed on the first substrate and extends along the reinforcing member.

32 Claims, 8 Drawing Sheets

U.S. PATENT DOCUMENTS

| | | |
|---|---|---|
| 6,424,009 B1 | 7/2002 | Ju |
| 6,452,323 B1 * | 9/2002 | Byrum et al. ............... 313/483 |
| 6,489,719 B1 | 12/2002 | Young et al. |
| 6,495,262 B2 | 12/2002 | Igeta |
| 6,515,417 B1 | 2/2003 | Duggal et al. |
| 6,551,724 B2 | 4/2003 | Ishii et al. |
| 6,554,672 B2 | 4/2003 | Dunham et al. |
| 6,555,025 B1 | 4/2003 | Krupetsky et al. |
| 6,590,337 B1 | 7/2003 | Nishikawa et al. |
| 6,603,254 B1 | 8/2003 | Ando |
| 6,605,826 B2 | 8/2003 | Yamazaki et al. |
| 6,624,572 B1 | 9/2003 | Kim et al. |
| 6,646,284 B2 | 11/2003 | Yamazaki et al. |
| 6,650,392 B2 | 11/2003 | Iwangaga et al. |
| 6,660,547 B2 | 12/2003 | Guenther |
| 6,671,029 B1 | 12/2003 | Choi |
| 6,717,052 B2 * | 4/2004 | Wang et al. ................. 174/381 |
| 6,744,199 B1 | 6/2004 | Tanaka |
| 6,791,660 B1 | 9/2004 | Hayashi et al. |
| 6,831,725 B2 | 12/2004 | Niiya |
| 6,833,668 B1 | 12/2004 | Yamada et al. |
| 6,861,801 B2 * | 3/2005 | Kim et al. ................... 313/512 |
| 6,878,467 B2 | 4/2005 | Chung et al. |
| 6,896,572 B2 | 5/2005 | Park et al. |
| 6,914,661 B2 | 7/2005 | Masuda et al. |
| 6,924,594 B2 | 8/2005 | Ogura et al. |
| 6,936,963 B2 | 8/2005 | Langer et al. |
| 6,956,324 B2 | 10/2005 | Yamazaki |
| 6,956,638 B2 | 10/2005 | Akiyama et al. |
| 6,965,195 B2 | 11/2005 | Yamazaki et al. |
| 6,980,275 B1 | 12/2005 | Konuma et al. |
| 6,993,537 B2 | 1/2006 | Buxton et al. |
| 6,998,776 B2 | 2/2006 | Aitken et al. |
| 7,030,558 B2 | 4/2006 | Park et al. |
| 7,098,589 B2 | 8/2006 | Erchak et al. |
| 7,112,115 B1 | 9/2006 | Yamazaki et al. |
| 7,141,925 B2 | 11/2006 | Wittmann et al. |
| 7,154,218 B2 | 12/2006 | Murakami et al. |
| 7,178,927 B2 | 2/2007 | Seo |
| 7,186,020 B2 | 3/2007 | Taya et al. |
| 7,187,121 B2 | 3/2007 | Hasegawa et al. |
| 7,193,218 B2 | 3/2007 | Nagano |
| 7,193,364 B2 | 3/2007 | Klausmann et al. |
| 7,193,366 B2 | 3/2007 | Tomimatsu et al. |
| 7,202,602 B2 | 4/2007 | Anandan |
| 7,211,938 B2 | 5/2007 | Tanaka |
| 7,214,429 B2 | 5/2007 | Kato et al. |
| 7,247,986 B2 | 7/2007 | Kang et al. |
| 7,255,823 B1 | 8/2007 | Guether et al. |
| 7,291,977 B2 | 11/2007 | Kim et al. |
| 7,306,346 B2 | 12/2007 | Fukuoka et al. |
| 7,317,281 B2 | 1/2008 | Hayashi et al. |
| 7,332,858 B2 | 2/2008 | Nomura et al. |
| 7,342,357 B2 | 3/2008 | Sakano et al. |
| 7,344,901 B2 | 3/2008 | Hawtof et al. |
| 7,359,021 B2 | 4/2008 | Ota et al. |
| 7,371,143 B2 | 5/2008 | Becken et al. |
| 7,393,257 B2 | 7/2008 | Spencer et al. |
| 7,407,423 B2 | 8/2008 | Aitken et al. |
| 7,423,375 B2 | 9/2008 | Guenther et al. |
| 7,425,166 B2 | 9/2008 | Burt et al. |
| 7,425,518 B2 | 9/2008 | Yoshida et al. |
| 7,426,010 B2 | 9/2008 | Lee et al. |
| 7,452,738 B2 | 11/2008 | Hayashi et al. |
| 7,474,375 B2 | 1/2009 | Kwak et al. |
| 7,498,186 B2 | 3/2009 | Lee |
| 7,528,544 B2 | 5/2009 | Kwak et al. |
| 7,537,504 B2 | 5/2009 | Becken et al. |
| 7,514,280 B2 | 7/2009 | Lee |
| 7,564,185 B2 | 7/2009 | Song et al. |
| 7,579,203 B2 | 8/2009 | Yamazaki et al. |
| 7,579,220 B2 | 8/2009 | Ohnuma et al. |
| 7,585,022 B2 | 9/2009 | Achilles et al. |
| 7,586,254 B2 | 9/2009 | Kwak et al. |
| 7,597,603 B2 | 10/2009 | Becken et al. |
| 2003/0066311 A1 | 4/2003 | Li et al. |
| 2003/0077396 A1 | 4/2003 | LeCompte et al. |
| 2004/0069017 A1 | 4/2004 | Li et al. |
| 2004/0075380 A1 | 4/2004 | Takemoto et al. |
| 2004/0104655 A1 | 6/2004 | Kodera et al. |
| 2004/0169033 A1 | 9/2004 | Kuibira et al. |
| 2004/0169174 A1 | 9/2004 | Huh et al. |
| 2004/0206953 A1 | 10/2004 | Morena et al. |
| 2005/0127820 A1 | 6/2005 | Yamazaki et al. |
| 2005/0231107 A1 | 10/2005 | Yamazaki et al. |
| 2005/0233885 A1 | 10/2005 | Yoshida et al. |
| 2005/0248270 A1 | 11/2005 | Ghosh et al. |
| 2005/0275342 A1 | 12/2005 | Yanagawa |
| 2006/0082298 A1 | 4/2006 | Becken et al. |
| 2006/0084348 A1 | 4/2006 | Becken et al. |
| 2006/0088951 A1 * | 4/2006 | Hayashi et al. ............... 438/99 |
| 2006/0284556 A1 | 12/2006 | Tremel et al. |
| 2006/0290261 A1 | 12/2006 | Sawai et al. |
| 2007/0120478 A1 | 5/2007 | Lee et al. |
| 2007/0128966 A1 * | 6/2007 | Becken et al. ................. 445/25 |
| 2007/0170324 A1 | 7/2007 | Lee et al. |
| 2007/0170423 A1 | 7/2007 | Choi et al. |
| 2007/0170605 A1 | 7/2007 | Lee et al. |
| 2007/0170839 A1 | 7/2007 | Choi et al. |
| 2007/0170845 A1 | 7/2007 | Choi et al. |
| 2007/0170850 A1 | 7/2007 | Choi et al. |
| 2007/0170855 A1 | 7/2007 | Choi et al. |
| 2007/0170857 A1 | 7/2007 | Choi et al. |
| 2007/0170859 A1 | 7/2007 | Choi et al. |
| 2007/0170860 A1 | 7/2007 | Choi et al. |
| 2007/0170861 A1 | 7/2007 | Lee et al. |
| 2007/0171637 A1 | 7/2007 | Choi |
| 2007/0172971 A1 | 7/2007 | Boroson |
| 2007/0173167 A1 | 7/2007 | Choi et al. |
| 2007/0176549 A1 | 8/2007 | Park |
| 2007/0197120 A1 | 8/2007 | Lee |
| 2007/0232182 A1 | 10/2007 | Park |
| 2008/0074036 A1 | 3/2008 | Wang et al. |

FOREIGN PATENT DOCUMENTS

| | | |
|---|---|---|
| CN | 1438825 | 8/2003 |
| CN | 1551686 A | 12/2004 |
| CN | 1212662 | 7/2005 |
| JP | 04-147217 | 5/1992 |
| JP | 06-34983 | 2/1994 |
| JP | 06-337429 | 10/1994 |
| JP | 07-74583 | 3/1995 |
| JP | 09-258671 | 3/1997 |
| JP | 09-278483 | 10/1997 |
| JP | 10-74583 | 3/1998 |
| JP | 10-074583 | 3/1998 |
| JP | 10-161137 | 6/1998 |
| JP | 63-163423 | 7/1998 |
| JP | 10-201585 | 8/1998 |
| JP | 11-007031 | 1/1999 |
| JP | 11-202349 | 7/1999 |
| JP | 2001-022293 | 1/2001 |
| JP | 2001-052858 | 2/2001 |
| JP | 2001-55527 | 2/2001 |
| JP | 2001-203076 | 2/2001 |
| JP | 2001-110564 | 4/2001 |
| JP | 2001-230072 | 8/2001 |
| JP | 2001-319775 | 11/2001 |
| JP | 2002 020169 | 1/2002 |
| JP | 2002-93576 | 3/2002 |
| JP | 2002-100472 | 4/2002 |
| JP | 2002 117777 | 4/2002 |
| JP | 2002 170664 | 6/2002 |

| | | |
|---|---|---|
| JP | 2002-216951 | 8/2002 |
| JP | 2002-280169 | 9/2002 |
| JP | 2002-318547 | 10/2002 |
| JP | 2001-324662 | 11/2002 |
| JP | 2002-359070 | 12/2002 |
| JP | 2003-123966 | 4/2003 |
| JP | 2003-228302 | 8/2003 |
| JP | 2003 243160 | 8/2003 |
| JP | 2003 297552 | 10/2003 |
| JP | 2003-332061 | 11/2003 |
| JP | 2004 29552 | 1/2004 |
| JP | 2004 070351 | 3/2004 |
| JP | 04-151656 | 5/2004 |
| JP | 2004 303733 | 10/2004 |
| JP | 2004 319103 | 11/2004 |
| JP | 2005-049808 | 2/2005 |
| JP | 2005-71984 | 3/2005 |
| JP | 2005-112676 | 4/2005 |
| JP | 2005-510831 | 4/2005 |
| JP | 2005-123089 | 5/2005 |
| JP | 2005 158672 | 6/2005 |
| JP | 2005 190683 | 7/2005 |
| JP | 2005 251415 | 9/2005 |
| JP | 2005 258405 | 9/2005 |
| JP | 2005 340020 | 12/2005 |
| JP | 2006 524419 | 10/2006 |
| KR | 10-2000-0045292 | 7/2000 |
| KR | 10-2001-0084380 | 9/2001 |
| KR | 10-2002-0051153 | 6/2002 |
| KR | 10-2003-0044656 | 6/2003 |
| KR | 10-2004-0011138 | 2/2004 |
| KR | 10-2005-070543 | 7/2005 |
| KR | 10-2005-0112318 | 11/2005 |
| KR | 10-2005-0115408 | 12/2005 |
| KR | 10-2006-0005369 | 1/2006 |
| TW | 569166 | 1/2004 |
| TW | I227094 | 1/2005 |
| TW | I228686 | 3/2005 |
| TW | I237218 | 8/2005 |
| TW | 200541379 | 12/2005 |
| TW | 200541382 | 12/2005 |
| WO | WO 02/21557 | 3/2002 |
| WO | WO 03/005774 | 1/2003 |
| WO | WO 2004-095597 | 4/2004 |
| WO | WO 2004/094331 | 11/2004 |
| WO | WO 2004/112160 | 12/2004 |
| WO | WO 2005/050751 | 6/2005 |

OTHER PUBLICATIONS

Japan Office Action dated Jul. 28, 2009 of the Japanese Patent Application No. 2006 178508.
Japan Office Action dated Jul. 14, 2009 of the Japanese Patent Application No. 2006-151960.
Japan Office Action dated Jul. 14, 2009 of the Japanese Patent Application No. 2006-165210.
Japanese Office Action issued Sep. 8, 2009 in Japanese Patent Application 2007-011996.
Chinese Office Action and English translation in corresponding Patent Application No. 200710000143.2 dated Sep. 26, 2008.
Chinese Office Action issued Oct. 10, 2008 in corresponding Patent Application No. 2007100040808.
Chinese Office Action issued Aug. 1, 2008 Patent Application No. 200710001301.6 with English translation.
Chinese Office Action issued Oct. 10, 2008 in Corresponding Patent Application No. 200710003941.0 with its English translation—11 pages.
Chinese Office Action issued Oct. 10, 2008 in Patent Application No. 200710001782.0.
Chinese Office Action issued on Aug. 1, 2008 in corresponding Patent Application No. 2007100015717 (w/English translation) in 19 pages.
Chinese Office Action Issued on Dec. 19, 2008 in Corresponding Patent Application No. 2007100072531 with its English translation—13 pages.
Chinese Rejection Decision issued on May 8, 2009 in the corresponding Patent Application No. 200710004080.8.
Chinese Office Action issued on Jan. 8, 2010 in corresponding Patent Application No. 200710003941.0.
European Search Report from the corresponding European Patent Application No. 07101294.2 dated Jun. 6, 2007.
European Search Report from the corresponding European Patent Application No. 07101295.9 dated May 24, 2007.
Korean Office Action issued Feb. 12, 2007 in counterpart Korean Patent Application No. 10-2006-0035455.
Taiwanese Office Action issued Jan. 18, 2010 from corresponding TW Application No. 95145107 (which claims priority to KR App. No. 10-2006-0008463).
Taiwanese Office Action Issued Apr. 2, 2010 from corresponding TW Application No. 95144932.
U.S. Office Action dated Feb. 2, 2009 in U.S. Appl. No. 11/529,916.
U.S. Office Action dated Apr. 3, 2009 in U.S. Appl. No. 11/529,891.
U.S. Office Action dated Apr. 3, 2009 in U.S. Appl. No. 11/541,055.
U.S. Office Action dated Mar. 29, 2010 in U.S. Appl. No. 11/541,055.
U.S. Office Action dated Aug. 19, 2009 in U.S. Appl. No. 11/529,914.
U.S. Office Action (Advisory Action) dated May 19, 2010 in U.S. Appl. No. 11/529,914.
U.S. Office Action dated Dec. 30, 2009 in U.S. Appl. No. 11/541,139.
U.S. Office Action dated Nov. 5, 2009 in U.S. Appl. No. 11/541,047.
U.S. Office Action dated Nov. 28, 2007 in U.S. Appl. No. 11/540,150.
U.S. Office Action dated Aug. 21, 2008 in U.S. Appl. No. 11/540,150.
U.S. Office Action dated Nov. 15, 2007 in U.S. Appl. No. 11/541,009.
U.S. Office Action dated Jun. 19, 2008 in U.S. Appl. No. 11/541,009.
U.S. Office Action dated Dec. 3, 2008 in U.S. Appl. No. 11/541,009.
U.S. Office Action dated Apr. 30, 2009 in U.S. Appl. No. 11/540,151.
U.S. Office Action dated Feb. 11, 2009 in U.S. Appl. No. 11/529,883.
U.S. Office Action dated Jul. 17, 2009 in U.S. Appl. No. 11/529,883.
U.S. Office Action dated Dec. 8, 2008 in U.S. Appl. No. 11/540,021.
U.S. Office Action dated Apr. 27, 2009 in U.S. Appl. No. 11/540,021.
U.S. Office Action dated Feb. 19, 2009 in U.S. Appl. No. 11/540,024.
U.S. Office Action dated May 4, 2009 in U.S. Appl. No. 11/529,995.
U.S. Office Action dated May 25, 2010 in U.S. Appl. No. 11/529,995.
U.S. Office Action dated May 8, 2009 in U.S. Appl. No. 11/540,149.

* cited by examiner

ORGANIC LIGHT EMITTING DISPLAY AND FABRICATING METHOD OF THE SAME

CROSS-REFERENCE TO RELATED APPLICATIONS

This application claims the benefit of Korean Patent Application No. 10-2006-0008769, filed on Jan. 27, 2006 in the Korean Intellectual Property Office, the disclosure of which is incorporated herein by reference in its entirety. This application is related to and incorporates herein by reference the entire contents of the following concurrently filed applications:

BACKGROUND

1. Field of the Invention

The present invention relates to organic light emitting display devices and, more particularly, to packaging such devices.

2. Discussion of Related Art

In recent years, organic light emitting display using organic light emitting diode has been watched. The organic light emitting display is an emissive display, which electrically excites organic compound having fluorescent characteristic to emit light. The organic light emitting display can drive with a low voltage, has excellent light-emission, a wide angle of visibility, and a high-speed response. The organic light

| Title | Atty. Docket No. | Filing Date | Application No. |
|---|---|---|---|
| ORGANIC LIGHT-EMITTING DISPLAY DEVICE AND METHOD OF FABRICATING THE SAME | SDISHN.043AUS | | |
| ORGANIC LIGHT-EMITTING DISPLAY DEVICE AND METHOD OF MANUFACTURING THE SAME | SDISHN.045AUS | | |
| ORGANIC LIGHT EMITTING DISPLAY DEVICE | SDISHN.048AUS | | |
| ORGANIC LIGHT-EMITTING DISPLAY DEVICE WITH FRIT SEAL AND REINFORCING STRUCTURE | SDISHN.051AUS | | |
| ORGANIC LIGHT EMITTING DISPLAY DEVICE METHOD OF FABRICATING THE SAME | SDISHN.052AUS | | |
| ORGANIC LIGHT EMITTING DISPLAY AND METHOD OF FABRICATING THE SAME | SDISHN.053AUS | | |
| ORGANIC LIGHT-EMITTING DISPLAY DEVICE WITH FRIT SEAL AND REINFORCING STRUCTURE BONDED TO FRAME | SDISHN.054AUS | | |
| METHOD FOR PACKAGING ORGANIC LIGHT EMITTING DISPLAY WITH FRIT SEAL AND REINFORCING STURUTURE | SDISHN.055AUS | | |
| METHOD FOR PACKAGING ORGANIC LIGHT EMITTING DISPLAY WITH FRIT SEAL AND REINFORCING STURUTURE | SDISHN.056AUS | | |
| ORGANIC LIGHT-EMITTING DISPLAY DEVICE AND THE PREPARATION METHOD OF THE SAME | SDISHN.060AUS | | |
| ORGANIC LIGHT-EMITTING DISPLAY AND METHOD OF MAKING THE SAME | SDISHN.062AUS | | |
| ORGANIC LIGHT EMITTING DISPLAY AND FABRICATING METHOD OF THE SAME | SDISHN.063AUS | | |
| ORGANIC LIGHT EMITTING DISPLAY DEVICE AND MANUFACTURING METHOD THEREOF | SDISHN.064AUS | | |
| ORGANIC LIGHT-EMITTING DISPLAY DEVICE AND MANUFACTURING METHOD OF THE SAME | SDISHN.066AUS | | |
| ORGANIC LIGHT EMITTING DISPLAY AND FABRICATING METHOD OF THE SAME | SDISHN.067AUS | | |
| ORGANIC LIGHT EMITTING DISPLAY AND METHOD OF FABRICATING THE SAME | SDISW.017AUS | | |
| ORGANIC LIGHT EMITTING DISPLAY DEVICE METHOD OF FABRICATING THE SAME | SDISW.018AUS | | |
| ORGANIC LIGHT EMITTING DISPLAY AND METHOD OF FABRICATING THE SAME | SDISW.020AUS | | | emitting display includes a plurality of pixels formed on a substrate. Each of the pixels includes an organic light emitting diode and a thin film transistor (TFT) for driving the organic light emitting diode. Since such an organic light emitting diode is susceptible to oxygen and water, a sealing structure has been proposed to prevent the oxygen and moisture from contacting the organic material by covering a deposition substrate with a metal cap having absorbent or a sealing glass substrate. U.S. Pat. No. 6,998,776 discloses a structure for sealing an organic light emitting diode with a frit.

SUMMARY OF CERTAIN INVENTIVE ASPECTS

An aspect of the invention provides an organic light emitting display device, which may comprises: a first substrate comprising a first side surface; a second substrate comprising a first side surface and opposing the first substrate; an array of organic light-emitting pixels interposed between the first and second substrates; a frit seal interposed between the first substrate and the second substrate while surrounding the array, wherein the frit seal, the first substrate and the second substrate together define an enclosed space in which the array is located; and a first structure interposed between the first substrate and the second substrate and located outside the enclosed space, the first structure contacting the frit seal, the first substrate and the second substrate, wherein the first structure comprises a first side surface, and wherein the first side surface along with the first side surface of the first and second forms a generally smooth surface.

In the foregoing device, the generally smooth surface may be substantially free of a step. The first side surface of the first structure may contact the first side surfaces of the first and second substrates. The first structure may be made of a material substantially different from the first and second substrates. The generally smooth surface may be substantially planar. The first side surface of the first structure may have a roughness which is substantially the same as that of at least one of the first side surfaces of the first and second substrates. The first structure may further comprise a portion configured to block a light beam.

Still in the foregoing device, the first substrate may comprise a second side surface, the second substrate comprises a second side surface, wherein the device may further comprise a second structure comprising a second side surface, which faces generally the same direction as the second side surfaces of the first and second substrates, wherein the second structure may be interposed between the first and second substrates outside the enclosed space. The second surface of the second structure along with the second surfaces of the first and second substrates may form a second side of the device, and wherein the second side may comprise a stepped surface. The second surface of the second structure along with the second surfaces of the first and second substrates may form a substantially smooth surface. The frit seal may comprise one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

Another aspect of the invention provides a method of making an organic light-emitting display device, which may comprise: providing a unfinished product comprising: a first substrate, a second substrate opposing the first substrate, a first array of organic light-emitting pixels interposed between the first substrate and second substrate, a first frit seal interposed between the first substrate and second substrate and surrounding the first array, wherein the first frit seal, the first substrate and the second substrate together define a first enclosed space in which the first array is located, the first frit seal comprising a first segment, a second array of organic light-emitting pixels interposed between the first substrate and second substrate, a second frit seal interposed between the first substrate and second substrate and surrounding the second array, wherein the second frit seal, the first substrate and the second substrate together define a second enclosed space in which the second array is located, the second frit seal comprising a second segment, and a structure interposed between the first and second substrates and further between the first and second segments; and cutting the unfinished product into a first piece and a second piece such that each of the first and second pieces comprise a portion of the structure.

In the foregoing method, the first and second segments may extend substantially parallel, and wherein the structure may extend along the first and second segments. The structure may contact the first and second substrates, and wherein the structure may further contact the first and second frit seals.

Still in the foregoing method, the structure of the unfinished product may comprise a first portion, a second portion and a central portion sandwiched between the first and second portions, wherein the first piece may comprise the first portion and a piece of the central portion, and wherein the second piece may comprise the second portion and a piece of the central portion. The central portion may comprise a material is softer than the first and second portions. Each of the first, second and central portions may comprise a resin, wherein the resin of the central portion may be less cured than that of the first and second portions. The first portion may contact the first segment, and wherein the first portion may extend along the first segment. The first portion may be apart from the first segment with a gap, and wherein the first portion may extend along the first segment. The central portion may comprise a material configured to block a light beam. Providing may comprise providing the unfinished product in which the structure is made of a curable resin, wherein providing may further comprise applying a light beam to the structure while part of the light beam is blocked by the material configured to block the light beam, and wherein the light beam may cure the first and second portions of the structure. The first piece may comprise a side surface comprising a surface formed by the portion of the structure, wherein the side surface of the first piece may be generally smooth. The generally smooth surface may be substantially planar.

One aspect of the present invention provides an organic light emitting display and a fabricating method of the same, which may easily control a process, and improve a printing characteristic by forming two specific continuously arranged display panels to share with a reinforcing member. One aspect of the present invention provides an organic light emitting display and a fabricating method of the same, which may partially cure a shared reinforcing member using a metal pattern formed at one region of the reinforcing member that allows a cutting process of a substrate to be easily performed.

One aspect of the present invention provides an organic light emitting display, which may comprise: a first mother substrate including a first display panel and a second display panel, the first display panel having a first pixel region and a non-pixel region, and the second display panel being arranged sequential to the first display panel, and having a second pixel region and a second non-pixel region; a second mother substrate sealed to the first mother substrate in order to at least seal the first pixel region and the second pixel region; a frit disposed between the first non-pixel region and the second non-pixel region of the first mother substrate, and the second mother substrate, for adhering the first and second mother substrates to each other; a reinforcing member formed along a peripheral region of the frit to be shared by one region of the first non-pixel region and the second non-pixel region; and a metal pattern formed at least one region among regions shared with the reinforcing member to shield a cutting line.

One aspect of the present invention provides a method for fabricating an organic light emitting display including a first mother substrate including a first display panel and a second display panel, the first display panel having a first pixel region and a non-pixel region, and the second display panel being arranged sequential to the first display panel, and having a second pixel region and a second non-pixel region; and a second mother substrate sealed to the first mother substrate in order to at least seal the first pixel region and the second pixel region, which may comprise the steps of: (i) forming a metal pattern extending from one region of the second mother substrate; (ii) forming a frit between the first and second non-pixel regions and the second mother substrate and sintering the formed frit at a predetermined temperature; (iii) forming a reinforcing member to be shared by one of the first and second non-pixel regions along a peripheral region of the frit; (iv) sealing the second mother substrate to the first mother substrate so that the pixel region is sealed; (v) curing the reinforcing member; (vi) sintering the frit; and (vii) cutting the sealed first and second substrates along a formation region of the metal pattern to form a plurality of display panels.

BRIEF DESCRIPTION OF THE DRAWINGS

These and other aspects and advantages of the invention will become apparent and more readily appreciated from the following description of embodiments, taken in conjunction with the accompanying drawings of which.

DETAILED DESCRIPTION OF EMBODIMENTS

Hereinafter, embodiments according to the present invention will be described with reference to the accompanying drawings.

An organic light emitting display (OLED) is a display device comprising an array of organic light emitting diodes. Organic light emitting diodes are solid state devices which include an organic material and are adapted to generate and emit light when appropriate electrical potentials are applied.

Figure 5A:
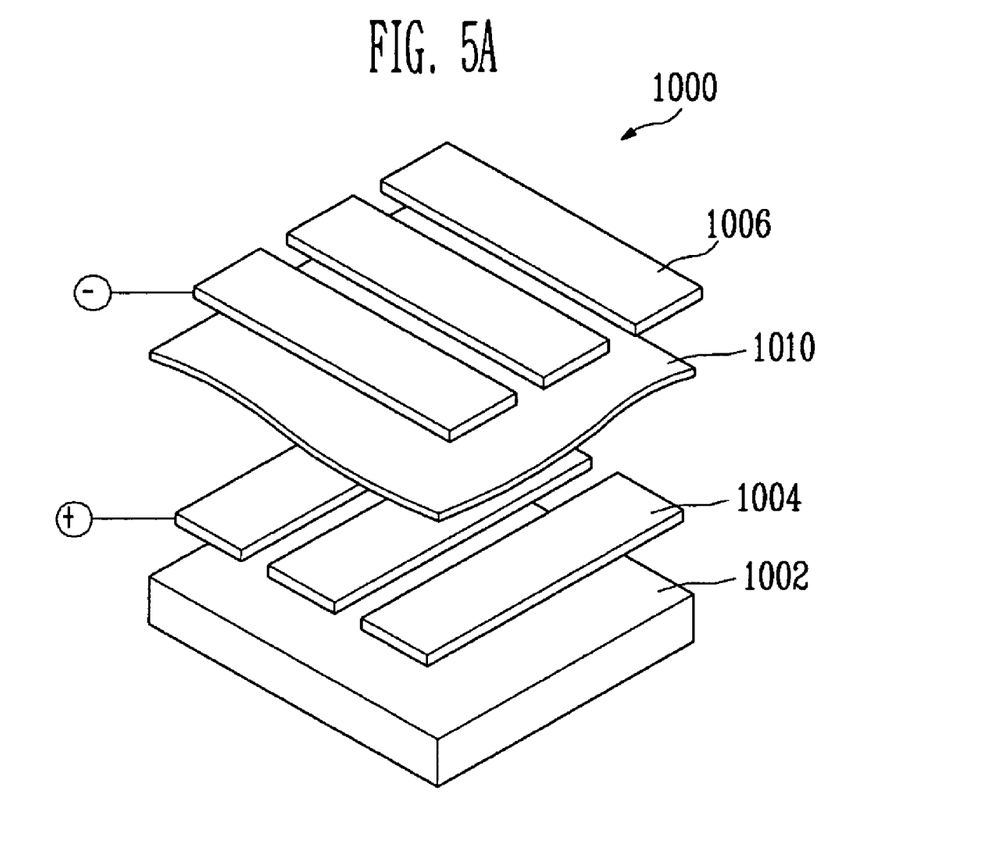
FIG. 5A is a schematic exploded view of a passive matrix type organic light emitting display device in accordance with one embodiment.
Figure 5B:
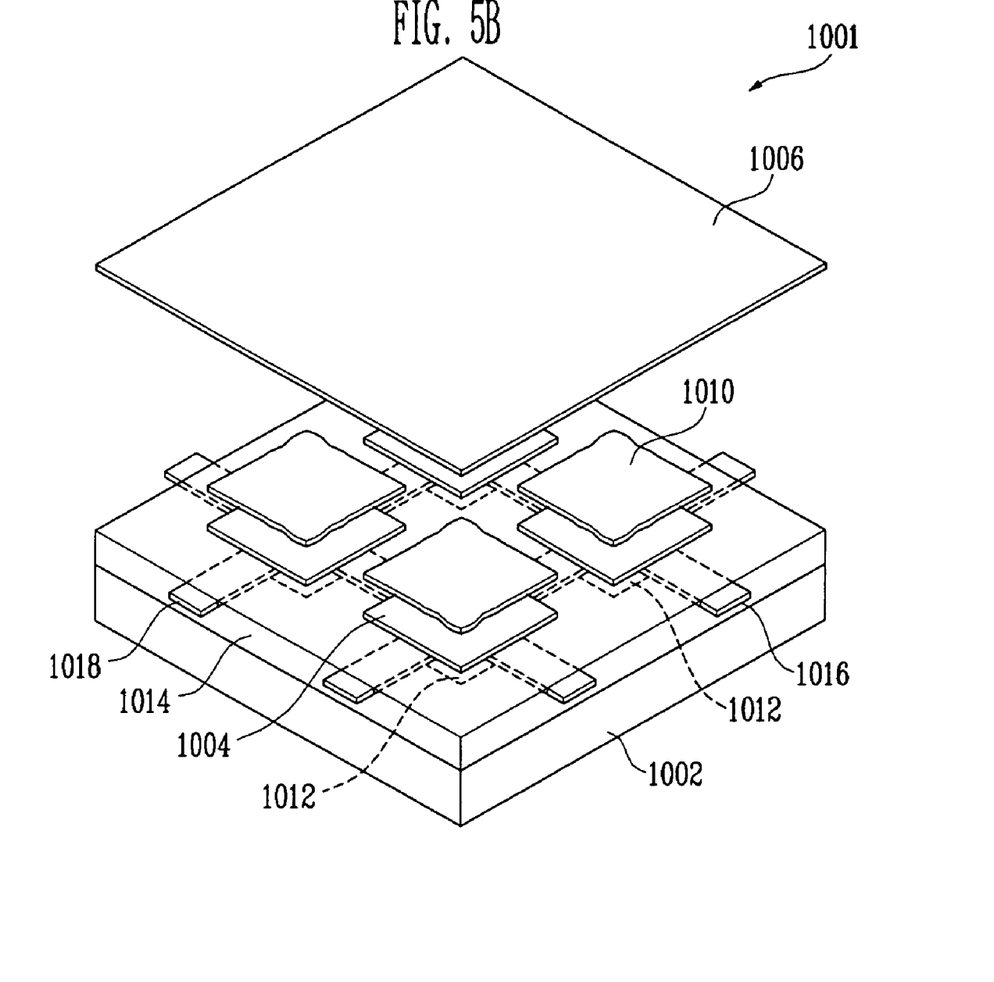
FIG. 5B is a schematic exploded view of an active matrix type organic light emitting display device in accordance with one embodiment.

OLEDs can be generally grouped into two basic types dependent on the arrangement with which the stimulating electrical current is provided. FIG. 5A schematically illustrates an exploded view of a simplified structure of a passive matrix type OLED 1000. FIG. 5B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 5A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 5B, the active matrix OLED (AMOLED) includes local driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 5C:
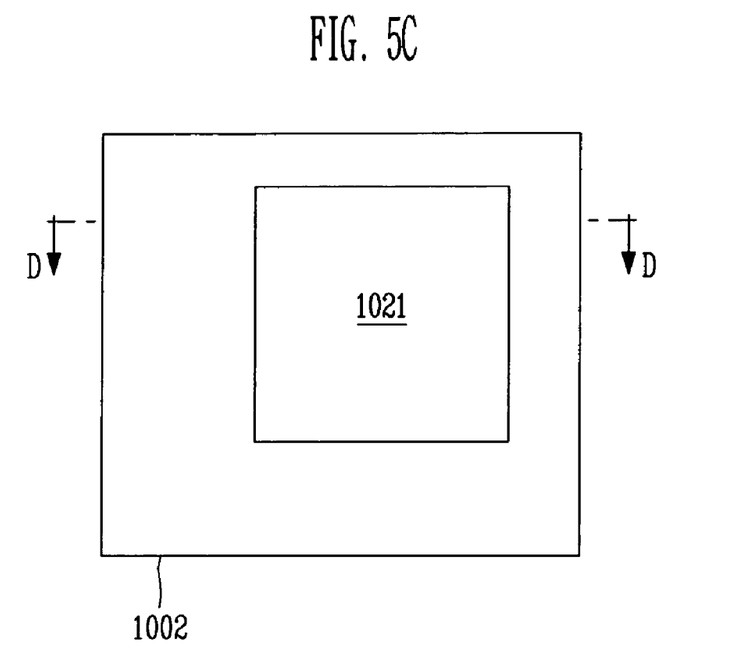
FIG. 5C is a schematic top plan view of an organic light emitting display in accordance with one embodiment.

In many embodiments, an OLED pixel array 1021 comprising a plurality of organic light emitting pixels is arranged over a substrate 1002 as shown in FIG. 5C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 5D:
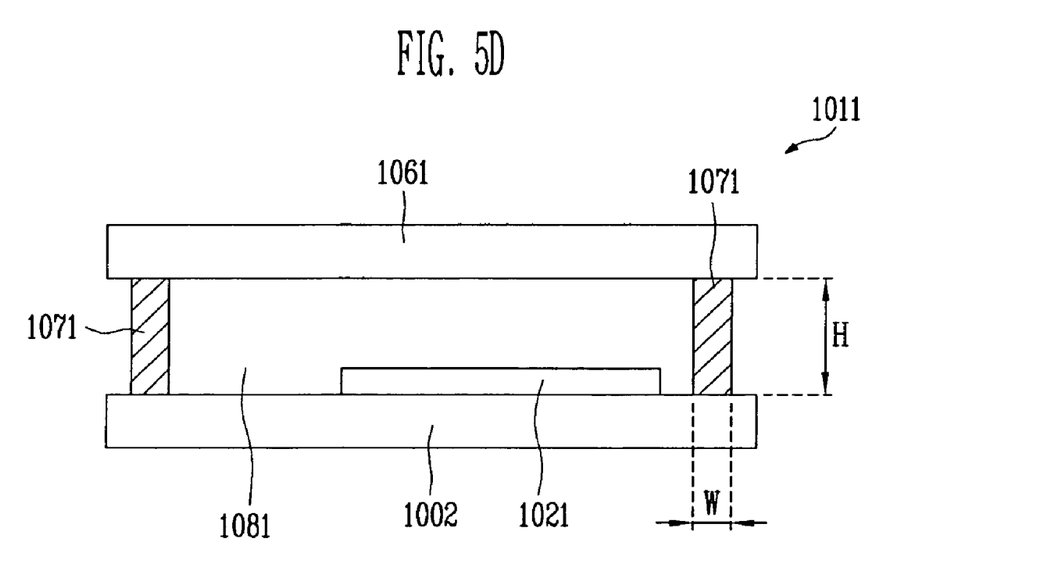
FIG. 5D is a cross-sectional view of the organic light emitting display of FIG. 5C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 5D schematically illustrates a cross-section of an encapsulated OLED device 1011 having a layout of FIG. 5C and taken along the line d-d of FIG. 5C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 5D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 5D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxylpropyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 5E:
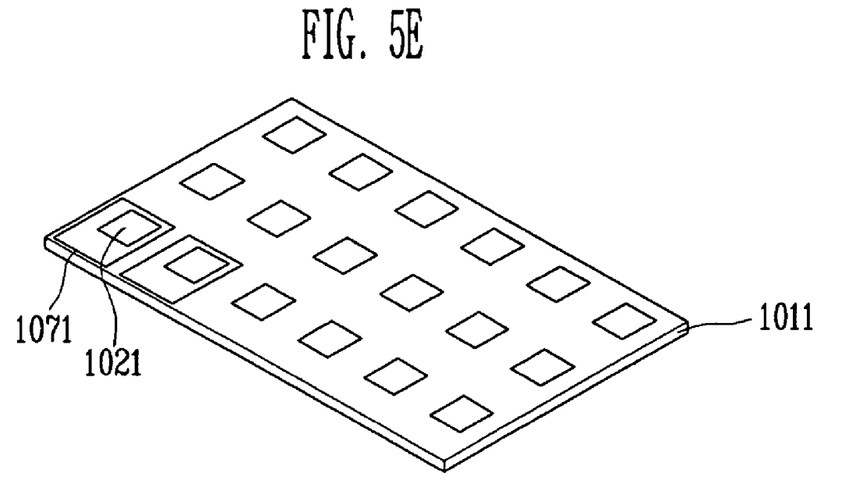
FIG. 5E is a schematic perspective view illustrating mass production of organic light emitting devices in accordance with one embodiment.

In some embodiments, OLED devices 1011 are mass produced. In an embodiment illustrated in FIG. 5E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 5D. In certain embodiments, the individual OLED devices 1011 then further undergo additional packaging operations to further improve the sealing formed by the frit seal 1071 and the top and bottom substrates 1061, 1002.

When cutting the resulting product into a plurality of OLED devices with frit seals, the damages such as crack may occur due to, for example, stress concentration. These damages may lead to a physical breakage of the devices and to decrease of reliability.

Figure 1A:
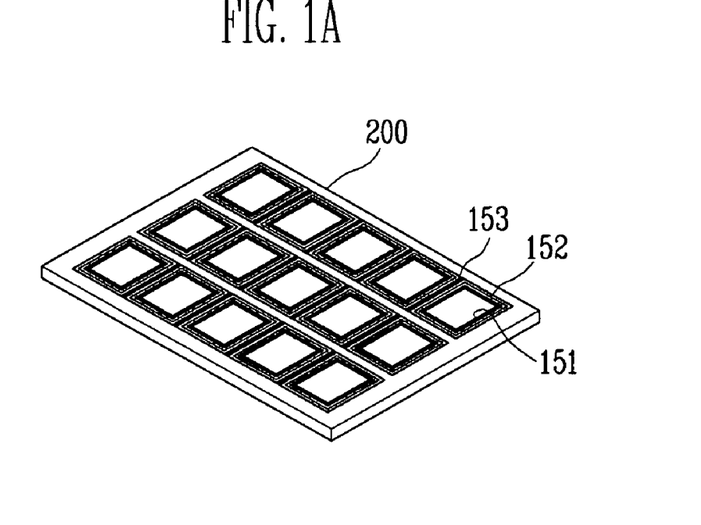
FIG. 1a to FIG. 1d are perspective views showing a plurality of organic light emitting display devices and a fabricating method thereof according to an embodiment of the present invention.
Figure 1B:
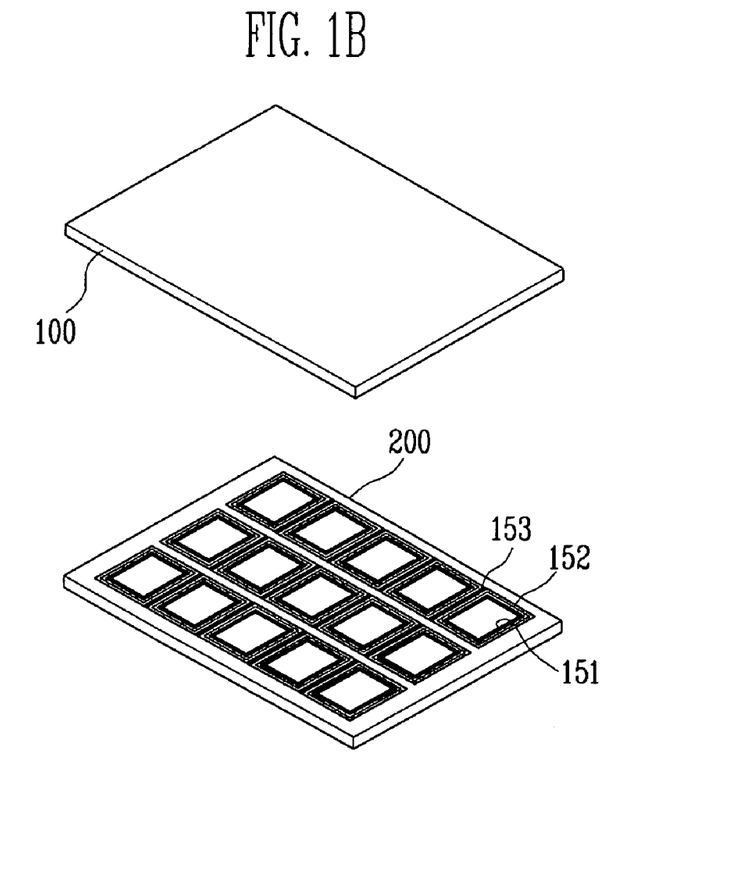
Figure 1C:
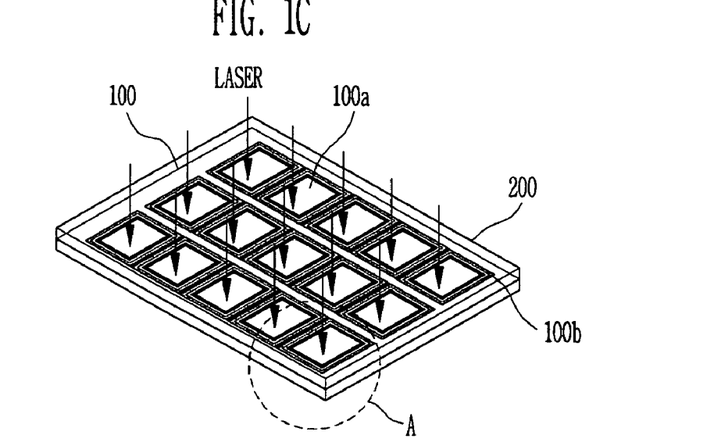
Figure 1D:
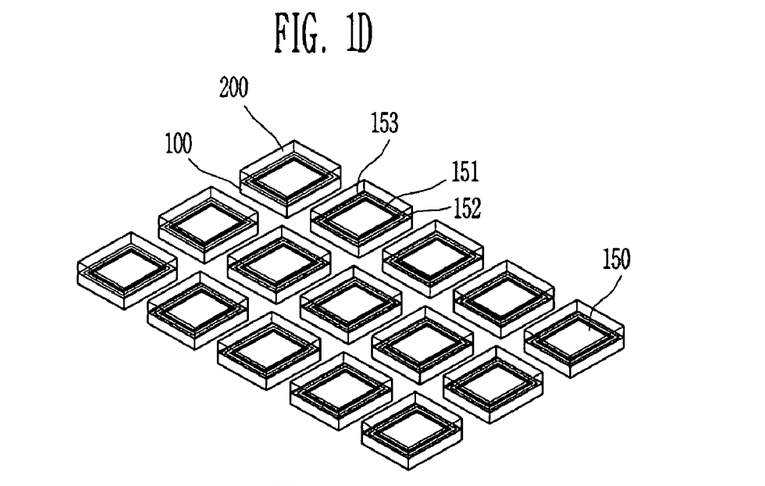
Figure 2:
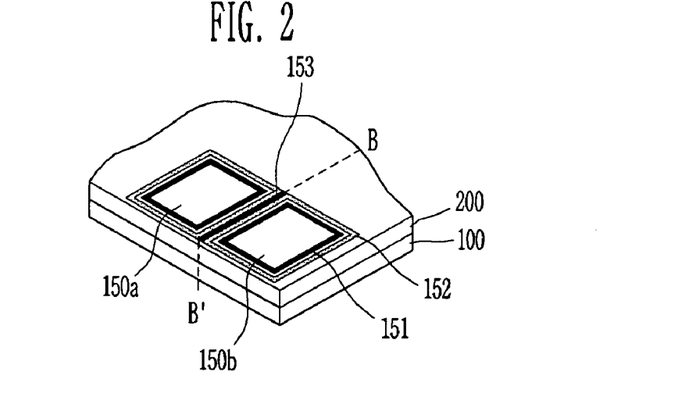
FIG. 2 is an enlarged perspective view showing a part A of FIG. 1c.

FIG. 1a to FIG. 1d are perspective views showing a plurality of organic light emitting display devices and a fabricating method thereof according to an embodiment of the present invention. FIG. 2 is an enlarged perspective view showing a part A of FIG. 1c. With reference to FIG. 1a to FIG. 1d, FIG. 2 and FIG. 4, hereinafter, two display panels among a plurality of display panels 150 arranged side by sides are referred to as "first display panel or device 150a" and "second display panel or device 150b".

A first substrate 100, which equivalent to the bottom plate 1002, includes at least a first display panel 150a and a second display panel 150b. The first display panel 150a includes a first pixel region 100a and a non-pixel region 100b. The second display panel 150a is arranged next to the first display panel, and includes a second pixel region 100a and a second non-pixel region 100b. A second substrate 200, which is equivalent to the top plate 1061, is attached to the first substrate 100 to seal at least the first pixel region 100a and the second pixel region 100b. First, a metal pattern is formed to extend from one region of the second substrate 200. The metal pattern 153 is formed to shield a cutting line B-B' for separating common substrates 100 and 200 into a plurality of display panels or devices 150. In one embodiment, the cutting line B-B' is positioned in the middle of the first non-pixel region 100b and the second non-pixel region 100b.

In the illustrated embodiment, the metal pattern 153 is shown in the drawings to extend on the second substrate 200, although not limited thereto. When the ultra-violet rays are irradiated to the reinforcing member 152 through the second substrate 200, the metal pattern 153 extending from one region of the second substrate 200 prevents a part of the reinforcing member 152 of the cutting line B-B' from being completely cured. That is, in one embodiment, the metal pattern 153 may be formed to extend on the first substrate 100. Here, the metal pattern 153 functions as a mask. Accordingly, in a process of curing a reinforcing member 152 using ultra-violet rays, when the ultra-violet rays are irradiated to the reinforcing member 152 through the first substrate 100, the metal pattern 153 extending on the first substrate 100 prevents a part of the reinforcing member 152 of the cutting line B-B' from being completely cured. In a device in which the reinforcing members 152 are completely cured, cutting process may result in damages of the sealed substrates 100 and 200 such as a crack. Here, the metal pattern 153 is formed by a metal material capable of blocking of ultra-violet rays. The metal pattern 153 is formed by at least one metal material selected from a copper or aluminum.

Next, frits 151 are formed at one side of the second substrate 200 to seal at least a pixel region 100a of the first substrate 100. That is, the frits 151 are coated along peripheral regions corresponding to a plurality of display panels (not shown). Here, each of the frit 151 includes a filler (not shown) and an absorbent (not shown). The filler adjusts a coefficient of thermal expansion. The absorbent absorbs a laser or an infrared ray. In one embodiment, when a temperature of heat applied to a glass material is suddenly reduced, the frit material in a glass power is produced. In general, a glass powder including an oxide powder is used. Further, when organic materials are added to the frit 151, a paste in a gel state is formed. After forming a frit material on the substrate, when the frit is sintered at a predetermined temperature, organic materials become extinct in the air, the paste in the gel state is cured and exits as a frit 151 in a solid state. In one embodiment, a temperature of sintering the frit 151 ranges from about 300° C. to about 700° C.

Then, a reinforcing member 152 is formed to extend along a peripheral region of the frit 151. Here, the reinforcing member 152 functions to lessen impacts applied to the frit 151 in a process of cutting the sealed substrates 100 and 200 into a plurality of display panels after the laser or the infrared ray was irradiated to the frit 151. Moreover, the reinforcing member 152 is further formed along an inner edge of the second substrate 200 so as to seal the second substrate 200 to the first substrate 100. Here, the reinforcing member 152 may be formed using a screen printing or dispensing method. The screen printing is provided by providing a mask having a desired design pattern at a metal sheet having a net structure and covering parts except the pattern using emulsion solution, and squeezing the reinforcing material by means of a squeezer, thereby resulting in a desired pattern of the reinforcing material on a second substrate. The dispensing is accomplished by placing the reinforcing material to have a predetermined shape and amount by means of a machine having a nozzle. At least one resin material selected from the group consisting of epoxy, acrylate, urethane acrylate, and acrylate cyanide may be used as the reinforcing member 150 (FIG. 1a).

In a next process, a first substrate 100 is arranged. Here, the first substrate 100 includes a first display panel 150a and a second display panel 150b. The first display panel 150a includes first pixel regions 100a and non-pixel regions 100b. The second display panel 150b is arranged next to the first display panel 150, and includes first pixel regions 100a and non-pixel regions 100b. At this time, to encapsulate a plurality of pixel regions 100a formed on the first substrate 100, a plurality of pixel regions 100a are arranged to face toward the second substrate 200 (FIG. 1b). Next, the first substrate 100 and the second substrate 200 are attached to each other, and the reinforcing member 152 is cured by a ultra-violet ray or thermal process. Then, a laser or infrared ray is irradiated to the frit 151 to be melted and resolidified. This causes the first substrate 100 and the second substrate 200 to be sealed (FIG. 1c).

The sealed substrates 100 and 200 are cut to be separated into a plurality of display panels 150. At this time, the first display panel 150a and the second display panel 150b are cut along the metal pattern 153 formed at one region of shared non-pixel regions 150b. During the ultra-violet ray irradiation, the reinforcing members in cutting regions were not completely cured, and thus, a cutting process can be easily accomplished without the damages such as a crack.

Figure 3:
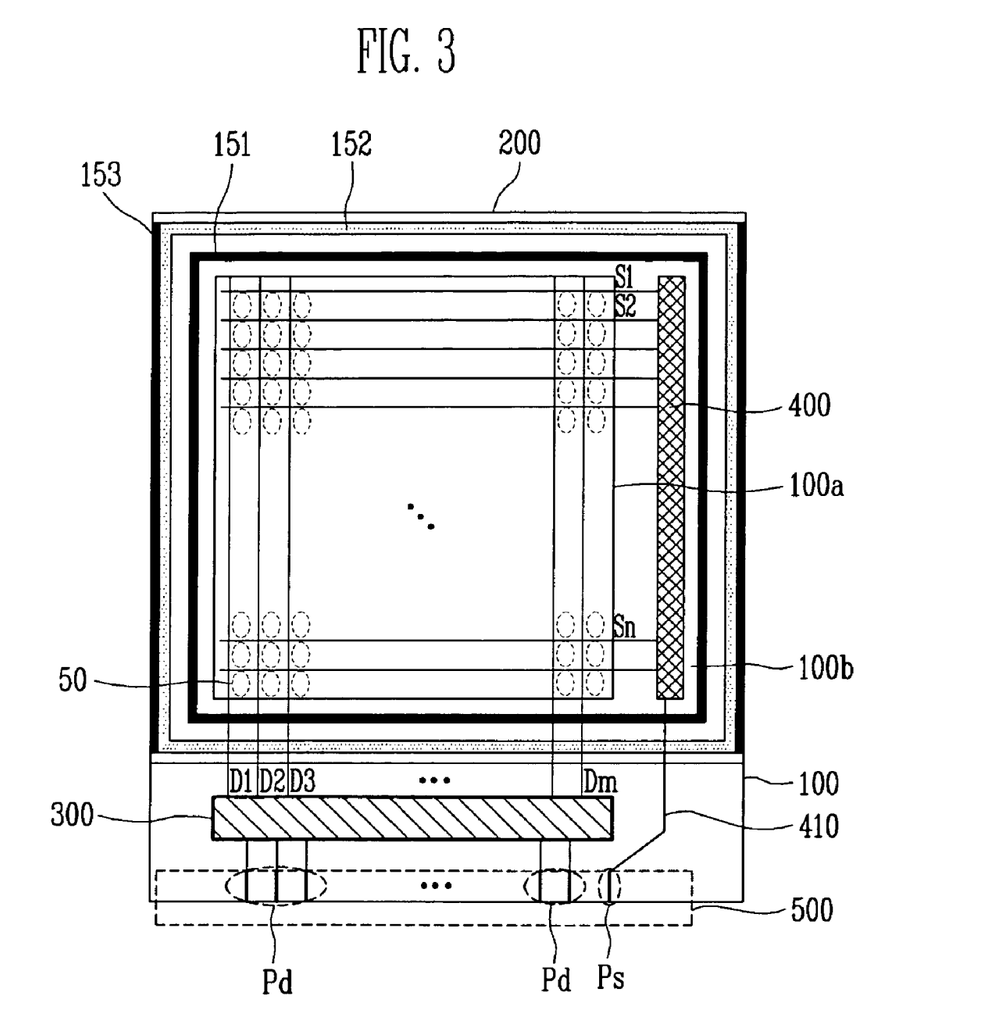
FIG. 3 is a cross-sectional view showing an organic light emitting display according to an embodiment of the present invention.
Figure 4:
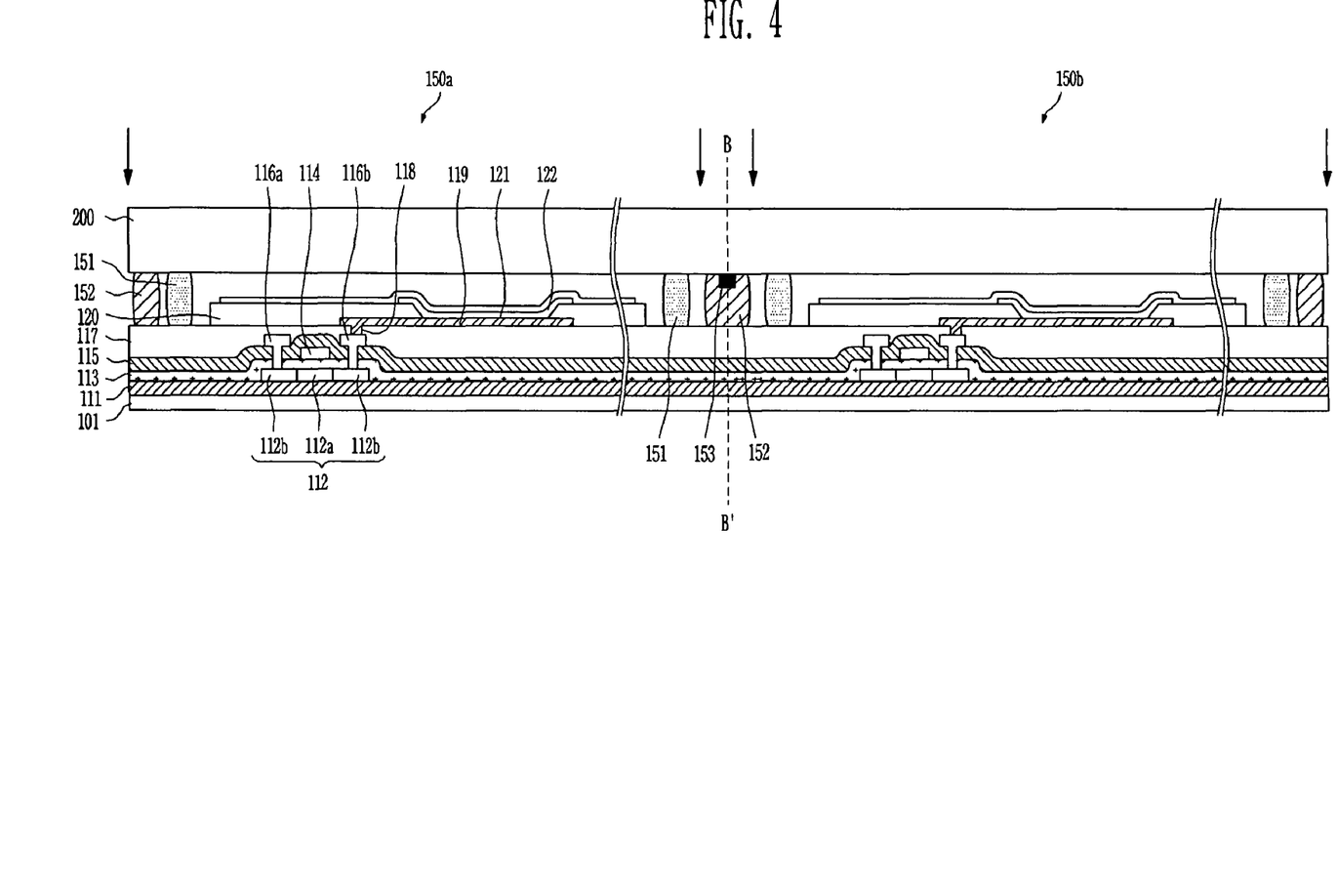
FIG. 4 is a cross-sectional view showing an unfinished product to be cut in accordance with one embodiment.

FIG. 3 is a cross-sectional view for showing an organic light emitting display according to an embodiment of the present invention. With reference to FIG. 3, the organic light emitting display device according to an embodiment of the present invention includes a first substrate 100, a frit 151, a reinforcing member 152, a metal pattern 153, and a second substrate 200. The first substrate 100 includes a deposition substrate 101 and at least one organic light emitting diode 110. The at least one organic light emitting diode 110 is formed on the deposition substrate 101. First, a buffer layer 111 is formed on the deposition layer 101. The deposition substrate 101 is formed by a glass. The buffer layer 111 is formed by an insulating material such as silicon oxide $SiO_2$, or silicon nitride $SiN_x$. On the other hand, the buffer layer 111 prevents the deposition substrate 101 from being damaged due to external heat and the like.

A semiconductor layer 112 is formed on at least one region of the buffer layer 111. The semiconductor layer 112 includes an active layer 112a and a source/drain region 112b. A gate insulation layer 113 is formed on the buffer layer 111 to have the semiconductor layer 112. A gate electrode 114 is formed on one region of the gate insulation layer 113. The gate electrode 114 has a size corresponding to a width of the active layer 112a. An interlayer insulation 115 is formed on the gate insulation layer 113 to have the gate electrode 114. Source and drain electrodes 116a and 116b are formed on a predetermined region of the interlayer insulation 115. The source and drain electrodes 116a and 116b are coupled to one exposed region of the source/drain region 112b. A planarization layer 117 is formed on the interlayer insulation 115 to have the source and drain electrodes 116a and 116b.

A first electrode 119 is formed on one region of the planarization layer 117. Here, the first electrode 119 is coupled with any one exposed region of the source and drain electrodes 116a and 116b through a via hole 118. A pixel definition film 120 is formed on the planarization layer 117 to have the first electrode 119. The pixel definition film 120 includes an opening portion (not shown) exposes at least one region of the first electrode 119. An organic layer 121 is formed on the opening portion of the pixel definition film 120. A second electrode layer 122 is formed on the pixel definition film 120 to have the organic layer 121. The frit 151 is disposed between the non-pixel region 100b of the first substrate 100 and the second substrate 200, and seals the first substrate 100 and the second substrate 200 to each other. The frit 151 may be coated so that pixel regions 100a formed at the first substrate 100 and a scan driver 400 are sealed. In an embodiment, the frit 151 is coated, thereby causing at least the pixel regions 100a to be sealed. The reinforcing member 152 is spaced along a peripheral region of the frit 151. At this time, the reinforcing member 152 functions to lessen impacts applied to the frit 151 or the substrates during the process of cutting the sealed substrates 100 and 200 into a plurality of display panels or devices after the laser irradiates to the frit 151.

The metal pattern 153 is formed at one region of a non-pixel region 150b disposed between the first display panel 150a and the second display panel 150b which are arranged side by side. At this time, the metal pattern 153 may be selectively formed on the first substrate 100 or the second substrate 200 in accordance with an irradiation direction of ultra-violet ray. In one embodiment, the metal pattern 153 can be also formed on both of the first substrate 100 and the second substrate 200. In certain embodiments, when the metal pattern 153 is formed on the first substrate 100, it can be made of either the same metal as that of the source and drain electrodes 116a and 116b, or the same metal as that of the gate electrode 114. In this case, without adding an additional formation process of the metal pattern 153, the metal pattern 153 can be formed simultaneously with either a formation process of the source/drain electrodes 116a and 116b, or a formation process of the gate electrode 114. In order to protect the aforementioned structures formed on the first substrate 100 from external oxygen and moisture, the second substrate 200 is attached to the first substrate 100 by means of the frit 151. In one embodiment, the second substrate 200 is formed by at least one material selected from the group consisting of silicon oxide $SiO_2$, silicon nitride $SiN_x$, and silicon oxynitride $SiO_xN_y$.

According to the organic light emitting display and a method for fabricating the same, by forming a common reinforcing member at non-pixel regions of two specific display panels arranged side by side, a process may be easily controlled and a printing characteristic may be enhanced. Further, a cutting process of sealed substrates can be easily performed by using a metal pattern formed on the shared reinforcing member. That is, the metal pattern functions as a mask causing the reinforcing member not to be completely cured, thereby improving an impact resistance of the sealed substrates.

Although embodiments of the present invention have been shown and described, it would be appreciated by those skilled in the art that changes might be made in these embodiments without departing from the principles and spirit of the invention and the scope of which is defined in the claims and their equivalents.

What is claimed is:

1. An organic light emitting display device, comprising:
a first substrate comprising a first side surface;
a second substrate comprising a first side surface and opposing the first substrate;
an array of organic light-emitting pixels interposed between the first and second substrates;
a frit seal interposed between the first substrate and the second substrate while surrounding the array, wherein the frit seal, the first substrate and the second substrate together define an enclosed space in which the array is located;
a first structure interposed between the first substrate and the second substrate and located outside the enclosed space, the first structure contacting the first substrate and the second substrate, wherein the first structure comprises a first side surface, and wherein the first side surface along with the first side surfaces of the first and second substrates forms a generally smooth surface; and
a metal piece located outside the enclosed space while interposed between and contacting the first and second substrates.

2. The device of claim 1, wherein the generally smooth surface is substantially free of a step.

3. The device of claim 1, wherein the first side surface of the first structure contacts the first side surfaces of the first and second substrates.

4. The device of claim 1, wherein the first structure is made of a material substantially different from the first and second substrates.

5. The device of claim 1, wherein the generally smooth surface is substantially planar.

6. The device of claim 1, wherein the first side surface of the first structure has a roughness which is substantially the same as that of at least one of the first side surfaces of the first and second substrates.

7. The device of claim 1, wherein the first structure further comprises a portion configured to block a light beam.

8. The device of claim 1, wherein the first substrate comprises a second side surface, the second substrate comprises a second side surface, wherein the device further comprises a second structure comprising a second side surface, which faces generally the same direction as the second side surfaces of the first and second substrates, wherein the second structure is interposed between the first and second substrates outside the enclosed space.

9. The device of claim 8, wherein the second surface of the second structure along with the second surfaces of the first and second substrates forms a second side of the device, and wherein the second side comprises a stepped surface.

10. The device of claim 8, wherein the second surface of the second structure along with the second surfaces of the first and second substrates forms a substantially smooth surface.

11. The device of claim 1, wherein the frit seal comprises one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

12. A method of making the organic light-emitting display device of claim 1, the method comprising:
    providing a unfinished product comprising:
        a first unfinished substrate,
        a second unfinished substrate opposing the first substrate,
        a first array of organic light-emitting pixels interposed between the first substrate and second substrate,
        a first frit seal interposed between the first unfinished substrate and second unfinished substrate and surrounding the first array, wherein the first fit seal, the first unfinished substrate and the second unfinished substrate together define a first enclosed space in which the first array is located, the first frit seal comprising a first segment,
        a second array of organic light-emitting pixels interposed between the first unfinished substrate and second unfinished substrate,
        a second frit seal interposed between the first unfinished substrate and second unfinished substrate and surrounding the second array, wherein the second frit seal, the first unfinished substrate and the second unfinished substrate together define a second enclosed space in which the second array is located, the second frit seal comprising a second segment, and
        a structure interposed between the first and second unfinished substrates and further between the first and second segments; and
    cutting the unfinished product into a first piece and a second piece such that each of the first and second pieces comprises a portion of the structure.

13. The method of claim 12, wherein the first and second segments extend substantially parallel, and wherein the structure extends along the first and second segments.

14. The method of claim 12, wherein the structure contacts the first and second substrates.

15. The method of claim 12, wherein the structure of the unfinished product comprises a first portion, a second portion and a central portion sandwiched between the first and second portions, wherein the first piece comprises the first portion and a piece of the central portion, and wherein the second piece comprises the second portion and a piece of the central portion.

16. The method of claim 15, wherein the central portion comprises a material is softer than the first and second portions.

17. The method of claim 15, wherein each of the first, second and central portions comprise a resin, wherein the resin of the central portion is less cured than that of the first and second portions.

18. The method of claim 15, wherein the first portion contacts the first segment, and wherein the first portion extends along the first segment.

19. The method of claim 15, wherein the first portion is apart from the first segment with a gap, and wherein the first portion extends along the first segment.

20. The method of claim 15, wherein the central portion comprises a material configured to block a light beam.

21. The method of claim 20, wherein providing comprises providing the unfinished product in which the structure is made of a curable resin, wherein providing further comprises applying a light beam to the structure while part of the light beam is blocked by the material configured to block the light beam, and wherein the light beam cures the first and second portions of the structure.

22. The method of claim 15, wherein the first piece comprises a side surface comprising a surface formed by the portion of the structure, wherein the side surface of the first piece is generally smooth.

23. The method of claim 22, wherein the generally smooth surface is substantially planar.

24. The method of claim 15, wherein the first piece comprises a side surface comprising a surface formed by the portion of the structure, wherein the side surface of the first piece is stepped.

25. An organic light emitting display device, comprising:
    a first substrate comprising a side surface;
    a second substrate opposing the substrate and comprising a first side surface;
    an array of organic light-emitting pixels interposed between the first and second substrates;
    a frit seal interposed between the first substrate and the second substrate while surrounding the array, wherein the frit seal, the first substrate and the second substrate together define an enclosed space in which the array is located;
    a reinforcing structure located outside the enclosed space while interposed between the first and second substrates, wherein the side surface of the first substrate and the reinforcing structure form a step therebetween; and a metal piece located outside the enclosed space while interposed between and contacting the first and second substrates.

26. The device of claim 25, wherein the metal piece contacts the reinforcing structure.

27. The device of claim 25, wherein the reinforcing structure comprises UV-cured resin.

28. The device of claim 25, wherein the reinforcing structure extends along the frit seal.

29. The device of claim 25, wherein the reinforcing structure substantially surrounds the frit seal.

30. The device of claim 25, wherein the side surface of the second substrate and the reinforcing structure form a step therebetween.

31. The device of claim 25, wherein the side surfaces of the first and second substrates face generally the same direction, wherein the reinforcing structure comprises a side surface interposed between the side surfaces of the first and second substrates when viewed in the direction.

32. The device of claim 25, wherein the first substrate comprises two or more edges, wherein the reinforcing structure is formed along the two or more edges.

* * * * *